United States Patent [19]

Okochi et al.

[11] Patent Number: 5,061,913

[45] Date of Patent: Oct. 29, 1991

[54] LIGHTWEIGHT LINE FILTER AND A METHOD FOR CONSTRUCTING A LIGHTWEIGHT LINE FILTER

[75] Inventors: Sadao Okochi, Fussa; Norio Kasama, Hinode; Hideji Matsuya, Ohme, all of Japan

[73] Assignee: Kabushiki Kaisha Toshiba, Kanagawa, Japan

[21] Appl. No.: 545,138

[22] Filed: Jun. 27, 1990

Related U.S. Application Data

[63] Continuation of Ser. No. 296,722, Jan. 12, 1989, abandoned.

[30] Foreign Application Priority Data

Jan. 14, 1988 [JP] Japan ................................. 63-6688
Aug. 31, 1988 [JP] Japan ................................. 63-217808

[51] Int. Cl.⁵ ............................................. H03H 7/09
[52] U.S. Cl. ..................................... 333/181; 333/12
[58] Field of Search ........................... 333/181, 25, 12

[56] References Cited

U.S. PATENT DOCUMENTS

| | | | |
|---|---|---|---|
| 1,824,819 | 9/1931 | Houck | 333/181 |
| 2,258,107 | 10/1941 | Buschbeck | 333/25 |
| 4,342,013 | 7/1982 | Kallman | 333/181 |
| 4,614,924 | 9/1986 | Kamitz et al. | 333/181 X |
| 4,667,173 | 5/1987 | Okochi | 333/25 X |
| 4,717,896 | 1/1988 | Graham | 333/25 |

FOREIGN PATENT DOCUMENTS

| | | |
|---|---|---|
| 0142809A1 | 5/1985 | European Pat. Off. . |
| 0186524A2 | 7/1986 | European Pat. Off. . |
| 61-157111 | 7/1986 | Japan . |
| 62-49715 | 3/1987 | Japan . |
| 62-53010 | 3/1987 | Japan . |

OTHER PUBLICATIONS

Sekhri, S. J., "Power Line Filter"; *IBM Technical Disclosure Bulletin;* vol. 17, No. 7; Dec. 1974; pp. 1998,1999.
Temes, Gabor C. and Mitra, Sanjit K., Modern Filter Theory and Design, John Wiley & Sons, pp. 222-225.
Toshiba Review, 1985, vol. 40, No. 1, pp. 10-12, Sadao Okochi, "Power Supply Complying with International Regulations for Personal Computers".
The 1988 Electricity Society of Japan, the all Japan Meeting, No. 460, Mar. 31, 1988, Okawauchi, Kazama, Matsutani, "The Analysis of the Noise Terminal Voltage in The Switching Power Source of AC Wide Input Type".
The Electron Information Information Communication Society of Japan, the technical research report, Sep. 12, 1988, Okawauchi, Kazama, Matsutani, "The Analysis of the Normal Mode Noise Terminal Voltage in the Switching Power Source of AC Wide Input Type", vol. 88, No. 171, pp. 17-23.
Official Proceedings of the First International PCIM '88 (Power Conversion) Conference, Dec. 8-10, 1988, Tokyo, Japan; S. Okochi, N. Kasama, E. Matsuya, "An Optimal Conducted EMI Reduction Scheme for Wide Input Voltage Range Off-Line Power Converters", pp. 433-442.
IEEE Transactions on Electromagnetic Compatibility, Nov., 1979, J. Hornsby, Jr.: "Predicting Insertion Loss of Common-Core Powerline Filters", pp. 320-335.
IEEE Symposium on Electromagnetic Compatibility, Aug., 1983, L. M. Schneider: "Noise Source Equivalent Circuit Model for Off-Line Converters and Its Use in Input Filter Design", pp. 167-175.
IEEE Power Electronics Specialists Conference Record, 1986, M. Albach: "Conducted Interference Voltage of AC-DC Converters", pp. 203-212.

*Primary Examiner*—Eugene R. Laroche
*Assistant Examiner*—Benny Lee
*Attorney, Agent, or Firm*—Finnegan, Henderson, Farabow, Garrett, and Dunner

[57] ABSTRACT

A line filter comprising a plurality of coils, one or more X capacitors is disclosed. Optionally, the line filter may comprise one or more Y capacitors. A method for constructing such a line filter is also disclosed. In one embodiment, a second X capacitor has a value approximately equal to the value of a first X capacitor if a circuit constant LT0 is less than a total inductance LT.

In another embodiment, a first and third coils in combination exhibit a normal inductance of $L_{1e}$, and a second and fourth coils in combination exhibit a normal mode inductance of $L_{2e}$. $L_{1e}$ is determined at a point of intersection between a first function f1 and a second function f2, and a second capacitor has an equivalent capacitive value $C_{X0}$ determined at a minimum of a third function, f3 ($C_{X0}$), expressing $L_{2e}$ as a function of $C_{X0}$.

9 Claims, 9 Drawing Sheets

LIGHTWEIGHT LINE FILTER AND A METHOD FOR CONSTRUCTING A LIGHTWEIGHT LINE FILTER

This application is a continuation of application Ser. No. 07/296,722, filed Jan. 12, 1989, abandoned.

The present application claims priority based on Japanese Patent Applications No. 63-6688 filed on Jan. 14, 1988, and No. 217,808 filed on Aug. 31, 1988.

FIELD OF THE INVENTION AND RELATED ART STATEMENT

The present invention relates to a value determining method for a line filter and its components which attenuate noise signals supplied from electronic appliances having built-in high-frequency noise sources (referred to as a noise source appliance), such as a switching power source.

In general, noise signals spread from a noise source appliance to external devices through a power line. When these signals are received by a pseudo-power circuit network, often referred to in the art as a line impedance stabilization network (LISN), their noise level (referred to as a noise terminal voltage) must be less than or equal to a legally-regulated value.

To meet this requirement, the prior art provides a line filter on the power supply side of the noise source appliance.

The line filter can effectively attenuate normal mode and common mode components, but is considerably bulky because of a built-in coil.

With a recent increase in demand for small or lightweight appliances, the line filter should include smaller, more lightweight, and cheaper elements whose characteristic values should be optimum.

In the prior art, however, only engineering experience and knowledge have significantly determined how to assemble elements for producing a line filter. Constructing an optimal line filter, therefore, has been quite burdensome. The line filter produced is often bulky or expensive.

This noise consist of a common mode noise flowing between a power line and the ground potential and a normal mode noise flowing between the power lines. In both cases, to attenuate the noise level, the line filter is inserted between a power line and a noise source.

A typical line filter comprises balun coils (i.e. a balanced-to-unbalanced transformer) providing two sets of windings on a ring core, these balun coils being longitudinally connected, capacitors inserted between a live line and a neutral line on the load side of each coil (referred to as X capacitors), and capacitors inserted between the power line and the ground potential on the load side of each coil (referred to as Y capacitors).

FIG. 16 is a circuit diagram showing the arrangement of a power source circuit employing this type of line filter.

In FIG. 16, 1 and 1' denote input terminals, 2 and 2' denote output terminals, G denotes a ground terminal, Rect denotes a diode bridge for rectifying alternating current into direct current, and $C_F$ denotes a capacitor for smoothing the rectified current.

T denotes a transformer consisting of a primary and a secondary coil, Q denotes a switching transistor, D denotes a diode for rectifying a voltage on the secondary coil of the transformer T, and $C_O$ denotes a capacitor for smoothing the rectified voltage.

$L_1$ and $L_2$ denote balun coils, $C_{x1}$ and $C_{x2}$ denote X capacitors connected between power lines, and $C_{y1}$ and $C_{y2}$ denote Y capacitors connected between the power line and the ground potential.

This circuit feeds direct current from the output terminals 3 and 3' on the secondary coil side to a load. The output terminal 3' is normally connected to ground to stabilize the operation of the electric circuit.

$C_c$ denotes the distribution capacitance generated between the primary coil and the secondary coil of the transformer T and passes the common mode noise generated by the switching transistor Q to the secondary side. The current flow through various components is shown by various arrows.

As set forth above, the noise can be grouped into common mode and normal mode components. The circuit shown in FIG. 16 has equivalent circuits shown in FIGS. 17 and 18 which demonstrate the attenuation of these two type noise components.

FIG. 17 is a view showing an equivalent circuit of the circuit shown in FIG. 16 which is designed to attenuate common mode noise.

In FIG. 17, $E_C$ denotes a common mode noise source, $I_C$ denotes the current flowing through $E_C$, RN denotes the impedance (generally, $RN = 50\Omega$) of an LISN circuit network, which is the equivalent impedance of an AC power line. The similar references denote similar elements shown in FIG. 16.

The Y capacitor $C_{y2}$ recovers most of the common mode noise flowing through the distribution capacitance $C_c$ as current $i_{c2}$. The Y capacitor $C_{y1}$ recovers most of the leakage noise as current $i_{c1}$. The remaining noise flows out as current $i_{RN}$.

To attenuate the noise components of lower harmonics, the Y capacitor $C_{y2}$ must have a high capacitance. However, it is subject to restrictions on safety standards for leakage current since it is connected to ground.

Rather than selecting a Y capacitor $C_{y2}$ with a high capacitance, therefore, the balun coil $L_2$ is chosen to have a high inductance. However, the balun coil $L_2$ passes high-frequency noise because it is a parasitic element and thus has a high distribution capacitance.

In this case, by connecting a balun coil $L_1$ with a smaller distribution capacitance to the input side of the balun coil $L_2$, it is possible to suppress the high frequency common mode noise.

In addition, one of the present inventors has already developed the method for effectively reducing the common mode noise components on the assumption of $L_1 < L_2$ and $C_{y1} < C_{y2}$ in the foregoing circuit (as disclosed in the Official Gazettes of Japanese Patent Laid-Open No. 61-157111 and U.S. Pat. No. 4,667,173).

FIG. 18 is a view showing an equivalent circuit of the circuit shown in FIG. 16, which is designed to attenuate normal mode noise.

In FIG. 18, I denotes switching current, which generates the normal mode noise and whose waveform is, as an example, shown to the right of the circuit. $C_F$ denotes a smoothing capacitor of the circuit which generates the switching current I. ESR denotes an equivalent serial resistor which is a parasitic element of the capacitor $C_F$. Also, the flow of various currents through various components is shown in FIG. 18.

In general, the capacitor $C_F$ generates a far larger voltage drop than ESR in the suppression of normal mode noise.

$L_{e1}$ and $L_{e2}$ respectively denote the leakage inductance of the balun coils $L_1$ and $L_2$, which creates impedance for suppressing the normal mode noise. RN denotes an equivalent impedance of the LISN circuit.

The noise current flowing through ESR becomes the normal mode noise $i_N$ which flows from the line filter to the power source. Most of the noise $i_N$ is recovered as current $i_{cx1}$ by the X capacitor $C_{x1}$, but some current partially leaks out. The leakage noise current $i_{RN}$ flows to the LISN through an AC-power line and is measured as noise.

The foregoing conventional line filter includes a capacitor $C_{x2}$ being connected in parallel with the smoothing capacitor $C_F$ (i.e. $C_F$ having a capacitance of several hundred μF). Yet, the capacitor $C_{x2}$ has an electrostatic capacitance of 0.1 to 0.5 μF, which is negligible in comparison with the capacitance of the capacitor $C_F$.

In this instance, the capacitor $C_{x2}$ has the following impedance in relation to the fundamental switching wavelength or lower harmonic frequency noise:

$$|1/\omega\, C_{x2}| >> \sqrt{ESR^2 + (1/\omega\, C_F)^2}$$

where $w = 2\pi$. frequency. This relationship indicates that the $C_{x2}$ capacitor does not effectively attenuate normal mode noise.

OBJECTS AND SUMMARY OF THE INVENTION

This invention is designed to overcome the foregoing shortcomings, and it is an object of this invention to provide a line filter which is excellent in an attenuating effect and a value determining method for components composing the line filter.

The line filter of this invention comprises two capacitors (C) connected between a pair of input lines and two inductors (L) inserted between the input side and the load side of each input line, these capacitors and inductors being combined in the sequence of C−L−C−L. Assuming that the total electrostatic capacitance of the two capacitors is CT (μF), the total inductance of the two inductors is LT (μH), a proportional factor of all the inductances is a, a proportional factor of all the capacitances is b, a frequency proportional factor is d, a frequency correction factor is e, and a minimum frequency of a normal mode noise source is F (KHz), the circuit constant can be represented by:

$$LT \geq a(b \cdot CT)^{-(dF+e)}$$

Another line filter comprises a capacitor (C) connected between a pair of input lines, two inductors (L) inserted between the input side and the load side of each input line, and these capacitor and inductors being combined in the sequence of L−C−L. Assuming that the total electrostatic capacitance of the two capacitors is CT (μF), the total inductance of the two inductors is LT (μH), a proportional factor of all the inductances is a, a proportional factor of all the capacitances is b, a frequency proportional factor is d, a frequency correction factor is e, and a minimum frequency of a normal mode noise source is F (KHz), the circuit constant can be represented by:

$$LT \leq a(b \cdot CT)^{-(dF+e)}$$

The foregoing line filter comprises at least two normal mode inductors L1 and L2 and at least one normal mode capacitor CX0 or CX1. The total electrostatic capacitance of the capacitors is CT (μF) and the minimum value (for example, a fundamental wavelength) of source noise frequencies to be suppressed is F (kHz).

The combination of the line filter with the desired element values depends upon the following relations between the sum LT of the inductances for the normal mode noise and LT0, which is given by:

$$LT0 = a(b \cdot CT)^{-(dF+e)}$$

That is, the line filter combination selected in the first instance:

LT ≧ LT0, is

CX0−L1−CX1−L2      (1)

(where CX0 ≈ CT/2 and CX1 ≈ CT/2); and in the second instance:

LT < LT0, is

L1−CX1−L2 (where CX1 = CT)      (2)

Therefore, the circuit constant of the line filter may be positively defined. This invention can thus offer a small and inexpensive line filter.

Further, the function of the line filter is determined by the values of components composing the line filter. The line filter comprises choke coils, respectively inserted on the power lines on the input and load sides of the line filter, and an X capacitor inserted on the power line on the input side of at least one of these choke coils. If two X capacitors are used, the X capacitors are assumed to be respectively inserted on the power lines on the input sides of the choke coils.

Further, assuming that the total electrostatic capacitance of the X capacitors and the inductance of one of the choke coils are constant, it is desirable to choose the electrostatic capacitances of the X capacitors so as to reduce the inductance of the other choke coil to a minimum. Under these selected capacitance values, the inductance of each choke coil can be optimally combined.

Assuming that the X capacitors are respectively inserted on the power lines on the input sides of the choke coils and that the total electrostatic capacitance of the X capacitors and the inductance of one of the choke coils is constant, a characteristic curve may be created.

Using this characteristic curve, it is possible to obtain the electrostatic capacitance of one of the X capacitors that brings about a minimum inductance of the undetermined choke coil, to create a characteristic curve which shows the relation between the inductances of respective choke coils, and to obtain proper combination of the inductances of the choke coils. This invention thus offers a high attenuation effect in a small and lightweight line filter.

DETAILED DESCRIPTION OF PREFERRED EMBODIMENTS

Hereinafter, an embodiment of this invention will be described with reference to the drawings.

Figure 1:
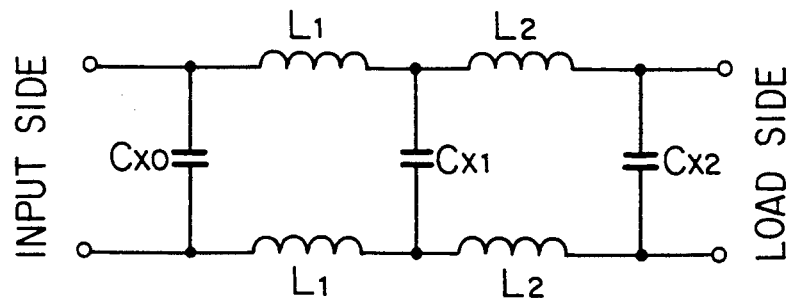
FIG. 1 shows an arrangement of a line filter for attenuating normal mode noise.

FIG. 1 shows an arrangement of a line filter for attenuating normal mode noise.

L1 and L2 denote inductors inserted between an input side and a load side of a power line, and CX0, CX1 and CX2 denote capacitors connected between a pair of power lines.

Figure 2:
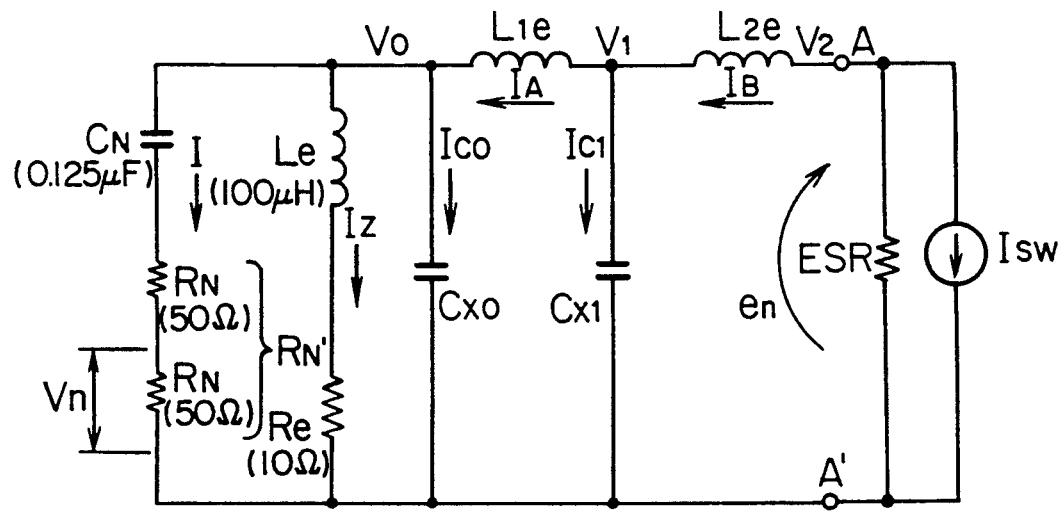
FIG. 2 shows an equivalent circuit for obtaining an optimal circuit constant of the line filter.

FIG. 2 shows an equivalent circuit for obtaining an optimal circuit constant of this line filter.

CN denotes a capacitor, which is one component of a pseudopower source circuit network (referred to as an LISN), RN denotes a resistor, which is one component of the LISN (such as the internal impedance of a jamming wave level detector Rx, not shown), Le denotes an inductance of all components composing the LISN, Re denotes resistance of all components composing the LISN, CX0 and CX1 denote capacitors for attenuating normal mode noise, L1e and L2e denote inductors for attenuating normal mode noise, and ESR denotes an equivalent serial resistor, which corresponds to the equivalent components of an electrostatic capacitor for smoothing.

Further, ISW denotes current produced by switching elements contained in a switching power source, en denotes an equivalent voltage source representing switching noise caused in the ESR, Vn denotes a noise voltage created in the resistor RN (to be measured by the jamming wave level detector, for example), I denotes equivalent current produced when the noise voltage Vn is assumed to be a regulated value (such as VDE standards, VDE0871, Class B), Vo denotes a voltage caused in a branch path consisting of a capacitor CN and the resistor RN, that is, $V_0 = 2RNI + 1/(j\omega CN) \cdot I$, where $\omega = 2\pi$ frequency, IZ denotes current flowing through Le and Re, Ico denotes current flowing through CX0, Ic1 denotes current flowing through CX1, IA denotes current flowing through the inductor L1e, IB denotes current flowing through the inductor L2e, and V2 denotes a voltage caused between A—A′.

RN′ denotes the equivalent resistance of the 2 resistors RN shown in FIG. 2.

Moreover, en=V2 when the noise terminal voltage Vn is assumed to equal the regulated value of VDE0871.

(1) Normal mode noise source

The source is a noise voltage which serves to cause switching current at both ends of the input side smoothing capacitor.

The noise voltage consists of internal components of the switching current produced on the electrostatic capacitance of the smoothing capacitor and voltage drop components caused by the ESR. If an aluminum electrolytic capacitor is employed, the noise voltage mainly consists of the ESR components.

(2) Filter circuit

A two-stage filter using two inductors is required to reduce the noise terminal voltage to the regulated value of the VDE standards VDE0871, Class B.

Hereinafter, the combinations of $CX0 - L_1 - CX1 - L_2$ and $L_1 - CX1 - L_2$ as shown in FIG. 1 are considered.

(3) LISN equivalent circuit

The LISN regulated on the VDE standards VDE0876 is considered.

In order to obtain the LISN equivalent constant, it is possible to separate the elements into RN elements, CN elements, and all of the remaining elements. The RN and CN elements are serially connected to an LISN jamming wave level detector (RX).

The elements, except RN and CN, are grouped as equivalent resistors Le and Re.

(4) Equivalent circuit used for calculation

FIG. 2 shows an equivalent circuit used for calculation to determine the attenuation effect of the filter.

The source is a power source, but it (the section in the right side of the line A—A′) could be replaced with an equivalent voltage source en.

(5) Studying noise characteristics

In the following, for the calculation corresponding to FIG. 2, $L_1$ and $L_2$ are used instead of $L_{1e}$ and $L_{2e}$, as a simpler expression of the normal mode inductance.

The filter elements should be selected from the following three cases.

1) $CX0 \cong CT/2$, $CX1 \cong CT/2$, $CX0 + CX1 = CT$
2) $CX0 = 0$, $CX1 = CT$
3) $CX0 = CT$, $CX1 = 0$ For each case, the arrangement of $L_1$, $L_2$, CX0, and CX1 was studied to obtain the maximum attenuation effect under the condition of $LT = L_1 + L_2$ (constant) and when LT=constant. Also the second and third cases were compared.

Assume that a 1 amp normal mode noise current flows through RN to obtain the damping capacity of a filter. The current should have a value so that Vn is equivalent to the VDE regulated value.

At this time, it is necessary to obtain the noise voltage V2 between the load terminals of the filter (Vn is assumed to remain at the regulated value of VDE0871, Class B).

$$V2 = \{(RN'I - XZIAi) - XB(IAi + IC1i)\} + j\{(XA \; IAr - I/Yn + XB(IAr + IC1r)\}$$

where RN′=2RN, r is representative of a real number portion, and i represents an imaginary number portion.

Further, assuming that IC1=CX1 current; IA=$L_1$ current; XA, XB=$L_1$, $L_2$ reactance ($=\omega L_1$, $\omega L_2$); Yn, Y0, Y1=CN, CX0, CX1 admittance ($=\omega CN$, $\omega CX0$, $\omega CX1$); $XA+XB=XT$ (=constant); and $Y0+Y1=YT$ (=constant); the formulas representing V2r and V2i are as follows:

$$V2r = RN'I - XT(Y0RN' - IZi)I - (XT-XA)(X-T-Y0)\{RN' - XA(Y0RN' - IZi)\}I \quad 4)$$

$$V2i = XT(1+IZr+Y0/Yn)I + (XT-XA)(YT-Y0)\{1/Yn - XA(1+IZr+Y0/Yn)\}I - 1/Yn \quad 5)$$

where IZr and IZi denote a real number and an imaginary number portion of a formula in which Iz represents current flowing through branch paths of Le and Re, as shown below:

$$IZr = (ReRN' - XeXn)/(Re^2 + Xe^2)$$

$$IZi = (RN'Xe + Re/Yn)/(Re^2 + Xe^2)$$

V2 is equal to an allowable value of the source noise voltage en. Assuming that:

$$en = \sqrt{V2r^2 + V2i^2} \text{ then} \quad 6)$$

$$K = en/Vn = \sqrt{V2r^2 + V2i^2}/(RN'I)$$

and the damping capacity IL of a filter IL=20 log K, optimizing the line filter for normal mode noise suppression results in selecting circuit elements so that IL is maximized under the conditions of CT=constant and LT=constant.

To simplify these relationships, one may substitute the conditions of the formulas 1) to 3) into formulas 4) and 5).

(i) $Y0 = \frac{1}{2}YT$, $Y1 = \frac{1}{2}YT$ (the case 1)) \quad 7)

To represent K as a function of XA, substitute formula 7) into formulas 4) and 5) and then the result into formula 6), which results in the following formulas:

$$K^2RN^2 = A0XA^4 + A1XA^3 + A2XA^2 + A3XA + A4 \quad 8)$$

$A0 = Mr^2 + Mi^2$ $A1 = -2(MrNr + MiNi)$ $A2 = Nr^2 + Ni^2 - 2MrPr + 2MiPi$ $A3 = 2(NrPr - NiPi)$ $A4 = Pr^2 + Pi^2$ $Mr = (YT/2)(YT\ RN/2) - IZi$ $Nr = YT\ RN/2 + (YT/2)XT(YT\ RN/2 - IZi)$ $Pr = RN(1 - YT\ XT) + XT\ IZi$ $Mi = (YT/2)(1 + IZr + YT/2\ Yn)$ $Ni = (YT/2)\{1/Yn + XT(1 + IZr + YT/2\ Yn)\}$ $Pi = XT(1 + IZr + YT/Yn) - 1/Yn$

Then, substitute f(XA) for the left side of the formula 8), which results in the following formula:

$$f(XA) = A0XA^4 + A1XA^3 + A2XA^2 + A3XA + A4 \quad 9)$$

Herein, it is possible to obtain an XA value that maximizes f(XA).

This value is XA which brings about a maximum value of IL in $Y0 = Y1 = \frac{1}{2}YT$.

(ii) Y0=0, Y1=YT (case 2) Y0=0, Y1=YT \quad 10)

For representing K as a function of XA, substitute the formula 10) into formulas 4) and 5) and then the result into formula 6). The result is the following formula:

$$f(XA) = A0XA^4 + A1XA^3 + A2XA^2 + A3XA + A4 \quad 11)$$

where, $A0 = Mr^2 + Mi^2$ $A1 = 2(MrNr - MiNi)$ $A2 = Nr^2 + Ni^2 + 2MrPr + 2MiPi$ $A3 = 2(NrPr - NiPi)$ $A4 = Pr^2 + Pi^2$ $Mr = YTIZi$ $Nr = YT(RN - XTIZi)$ $Pr = RN(1 - YTXT) + XTIZi$ $Mi = YT(1 + IZr)$ $Ni = YT\{1/Yn + XT(1 + IZr)\}$ $Pi = XT(1 + IZr + YT/Yn) - 1/Yn$ Like the first case, it is possible to obtain a value of XA which maximizes f(XA). This XA value is provided when IL is a maximum under the conditions of Y0=0 and Y1=YT.

Figure 3:
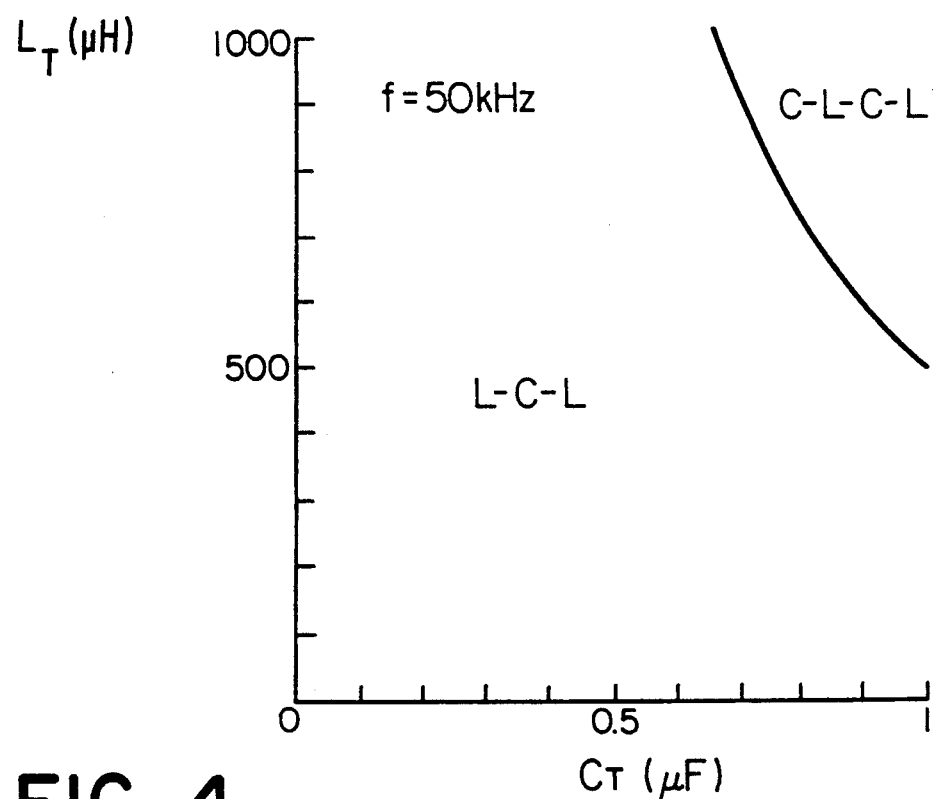
FIGS. 3 and 4 are graphs showing which one of two types of filters should be properly used.
Figure 4:
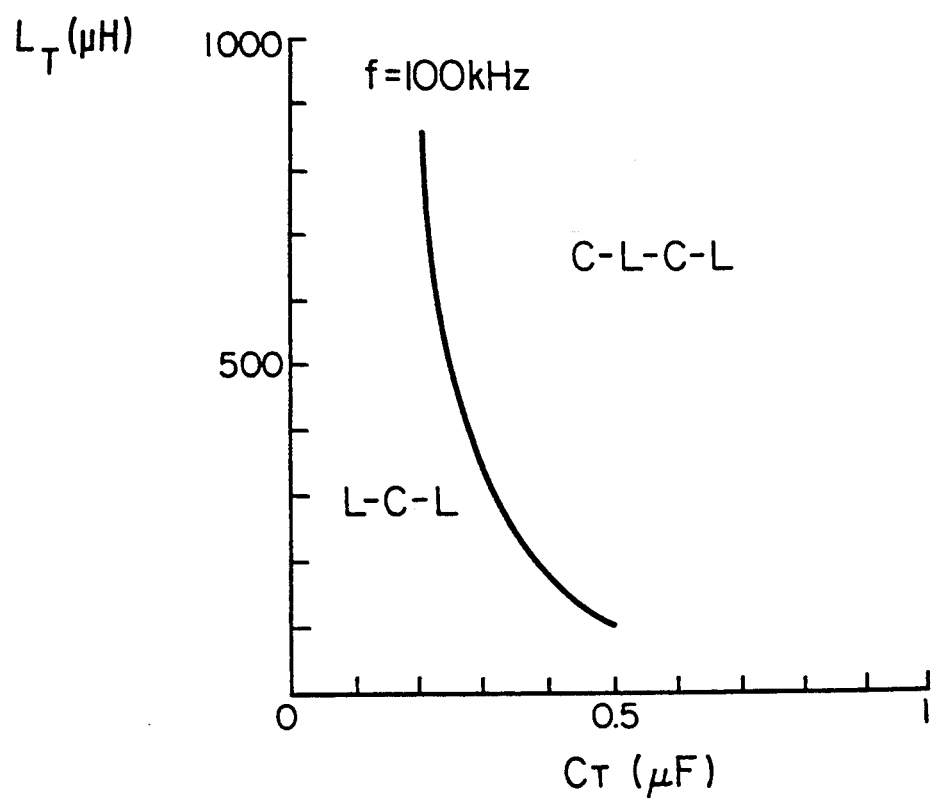

Holding YT and XT constant, FIGS. 3 and 4 compare maximum value of f(XA) obtained from the formula 9) with that obtained from the formula 11). FIGS. 3 and 4 may be used to determine a circuit arrangement having a larger damping capacity, i.e., under F=50 KHz as shown in FIG. 3. Two areas are shown in FIGS. 3 and 4: (i) an area where the C−L−C−L combination has a larger value; and (ii) an area where the L−C−L combination has a larger value. The border extends on the line where both circuit arrangements have the same IL value. Likewise, when F=100 KHz, the border extends as shown in FIG. 4.

By providing a minimum frequency F and certain CT and LT values, it is possible to define a filter arrangement having a higher damping capacity by reference to the borders as shown in FIGS. 3 and 4.

Once the filter arrangement is defined, it is also possible to obtain CX0 and CX1 from CT. Since the XA value that maximizes f(XA) can be obtained by reference to the formulas 9) and 11), the following formulas may be used to compute $L_1$ and $L_2$:

$$L_1 = XA/\omega \text{ and } L_2 = (XT-XA)/\omega$$

FIGS. 3 and 4 show graphs which may be approximated by the formula:

$$LT0 = a(b \cdot CT)^{-(dF+e)}$$

where a denotes a proportional factor of total inductance (= $2.39 \times 10^6$), b denotes a proportional factor of total electrostatic capacitance (=141), d denotes a frequency proportional factor (=0.0132), e denotes a frequency correction factor (= −1.055). LT may be expressed in $\mu H$, CT may be expressed in $\mu F$, and F may be expressed in KHz.

By providing CT, LT and F values, therefore, it is possible to select the circuit combination of $CX0-L_1-CX1-L_2$ if $LT \geq LT0$, or the combination of $L_1-CX-L_2$ if $LT < LT0$.

Reference has been heretofore directed to the line filter arrangement for attenuating normal mode noise. The line filter normally has a capability of attenuating common mode components because the noise source generally includes common mode components.

Figure 5:
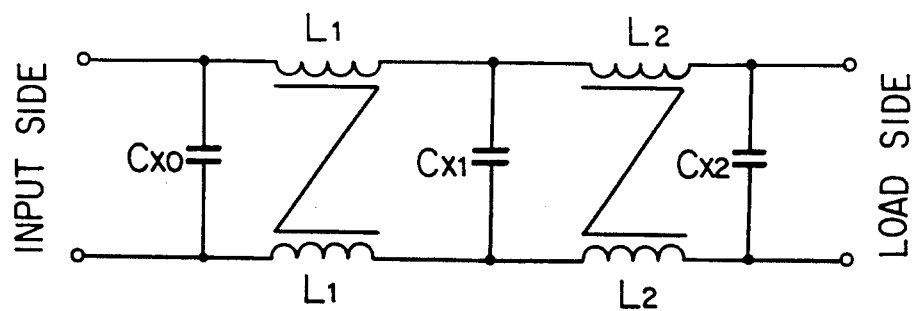
FIG. 5 shows an arrangement of a line filter for attenuating common mode noise.

The common mode choke coil for attenuating the common mode noise included in the line filter arrangement as shown FIG. 1 may attenuate the normal mode noise components if it employs leakage inductance. FIG. 5 shows a line filter arrangement for suppressing normal mode noise components which employs a common mode choke coil.

In FIG. 5, $L_1$ and $L_2$ denote inductors employing common mode choke coils, the leakage inductance serving to suppress the normal mode noise. CX0, CX1, and CX2 denote capacitors for suppressing the normal mode noise.

Figure 6:
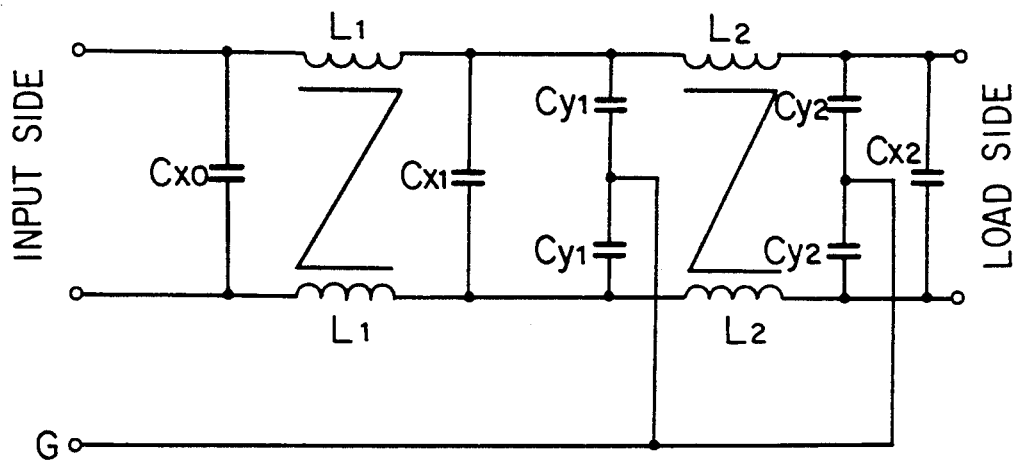
FIG. 6 shows an arrangement of the line filter for attenuating normal mode noise and common mode noise.

FIG. 6 shows a filter arrangement for attenuating the normal mode noise components a well as the common mode noise components including a Y capacitor.

In FIG. 6, CY1 and CY2 denote capacitors for suppressing the common mode noise. $L_1$ and $L_2$ denote inductors which respectively suppress the common mode noise using the common mode inductance and the normal mode noise using the leakage inductance.

Further, G denotes a ground terminal which is part of a common noise path. CX0, CX1, and CX2 denote capacitors for suppressing the normal mode noise.

CX2 is an additional capacitor for attenuating the normal mode noise.

The foregoing description has been directed to a single line filter. It is also possible to dispersively locate $L_1$, $L_2$, CX0, CX1, CX2, CY1, and CY2 in a power supply or an electronic device, for example.

The filter components may be divided into subgroups in various circuit components, such as the switch, fuse, rectifiers, etc, as shown in FIGS. 6, 7, 8, 10, 11, and 12 of U.S. Pat. No. 4,667,173 invented by one of the present inventors.

As set forth above, the line filter of this embodiment comprises at least two normal mode inductors and at least one normal mode capacitor. Assuming that the total electrostatic capacitance is CT ($\mu F$), the total inductance of the two inductors is LT ($\mu H$), a proportional factor of total inductance is a, a proportional factor of total capacitance is b, a frequency proportional factor is d, a frequency correction factor is e, and a minimum frequency of the normal mode noise source is F (KHz), it is possible to select the combination of $CX0-L_1-CX1-L_2$ if $LT \geq LT0$ or the combination of $L_1-CX1-L_2$ if $LT \leq LT0$, where LT denotes total normal mode noise inductance. LT0 is given by the formula:

$$LT0 = a(b \cdot CT)^{-(dF+e)}$$

The foregoing description offers definitive element values.

Next, a value determining method for line filter components will be described.

Figure 7:
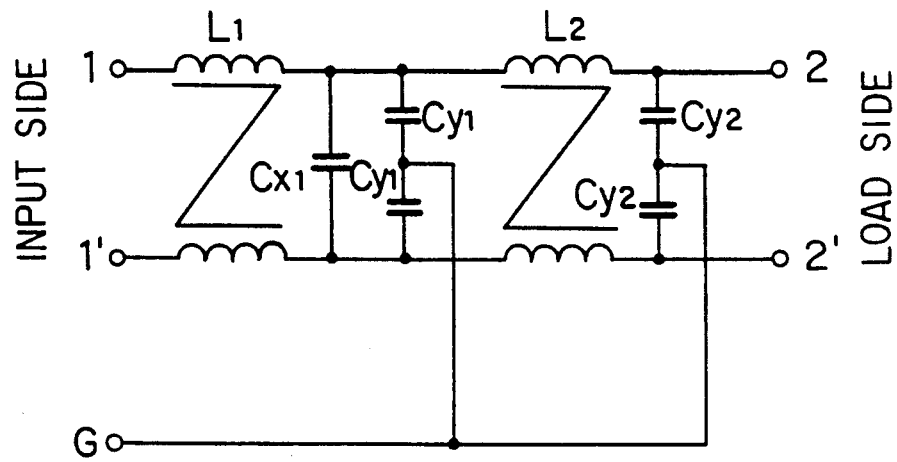
FIG. 7 is a circuit diagram showing a line filter.

FIG. 7 shows one embodiment of a line filter used to explain this method.

In FIG. 7, $L_1$ denotes a balun coil inserted on a power line on the input side, $L_2$ denotes a balun coil inserted on a power line on the load side, and $C_{x1}$ denotes an X capacitor inserted on the power line on the input side of the balun coil $L_2$.

$C_{y1}$ denotes a Y capacitor connected between a ground potential and power line on the load side of the balun coil $L_1$, $C_{y2}$ denotes a Y capacitor connected between a ground potential and power line on the load side of the balun coil $L_2$, 1 and 1' denote input terminals to be connected to power lines, 2 and 2' denote output terminals to be connected to load lines, and G notes a ground terminal connected to the ground of an AC-power source.

In this circuit, the balun coil $L_2$ has a larger inductance than the balun coil $L_1$, and the Y capacitor $C_{y2}$ has a larger electrostatic capacitance than the Y capacitor $C_{y1}$.

As shown in FIG. 7, the circuit of this embodiment provides the X capacitor for suppressing the normal mode noise between the balun coils L and $L_2$.

Figure 8:
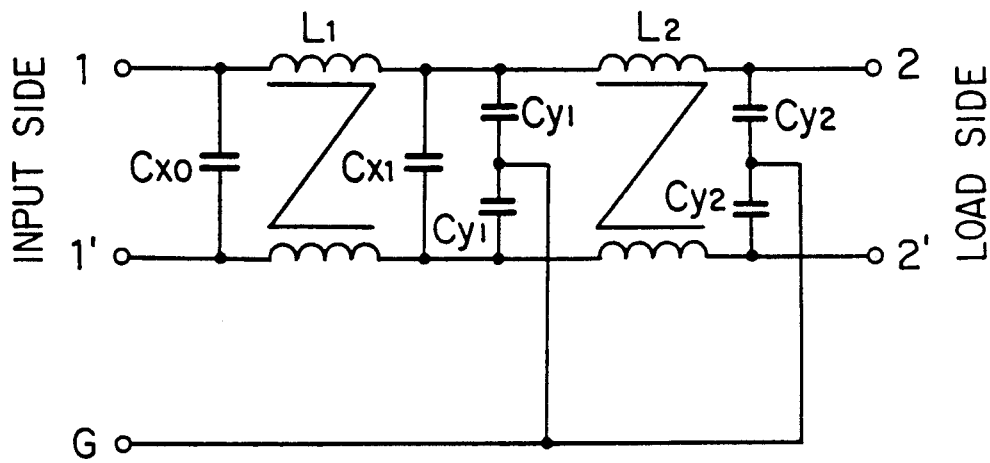
FIG. 8 shows an arrangement of a circuit to be compared with the circuit shown in FIG. 7.

FIG. 8 shows the arrangement of a circuit which will hereafter be compared with the circuit shown in FIG. 7.

In FIG. 8, an X capacitor $C_{x0}$ is inserted between the power lines on the input side of the balun coil $L_1$, and an X capacitor $C_{x1}$ is inserted between the power lines on the input side of the balun coil $L_2$. The other elements are similar to those in the circuit shown in FIG. 7.

Figure 9:
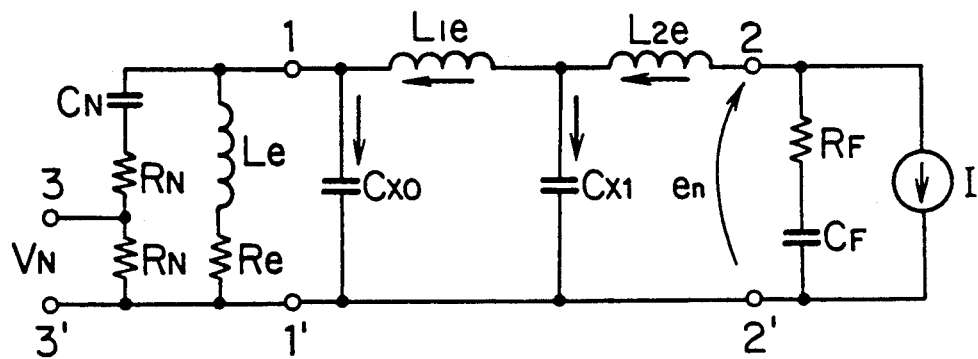
FIG. 9 shows an equivalent circuit of the circuit shown in FIG. 8 which attenuates normal mode noise.

FIG. 9 shows an equivalent circuit of the circuit shown in FIG. 8 which attenuates the normal mode noise.

In FIG. 9, I denotes a switching current source which generates the normal mode noise. $C_F$ denotes a smoothing capacitor which is a source of the switching current I.

$R_F$ denotes an equivalent serial resistor which is a parasitic element of the capacitor $C_F$, and $C_{x0}$ and $C_{x1}$ denote X capacitors connected between the power lines 1 and 1'.

$L_{1e}$ and $L_{2e}$ denote the leakage inductance of the balun coils $L_1$ and $L_2$, which provide impedance against the normal mode noise. RN denotes an equivalent impedance of the LISN.

CN denotes a high-pass filter capacitor which inhibits commercial frequency components and allows measuring noise to pass. Le and Re compose the remaining equivalent elements of the LISN, which respectively correspond to a reactance element and a resistance element for correcting low-pass impedance.

3 and 3' denote terminals for picking up the normal mode noise and connecting to a disturbance wave level detector, $V_N$ denote a voltage value of the normal mode noise components, and en denotes a voltage value of a source noise.

This circuit has a filter composed of $L_{1e}$, $L_{2e}$, $C_{x0}$, and $C_{x1}$. It serves to attenuate the noise generated in the equivalent serial resistor $R_F$ which is a parasitic element of the capacitor $C_F$.

Figure 16:
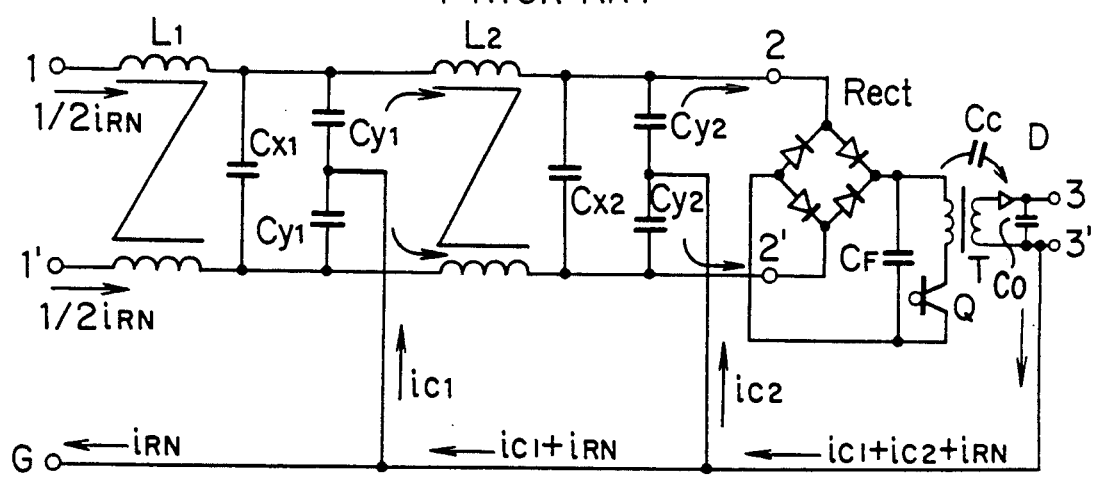
FIG. 16 shows one example of a power source arrangement employing a conventional line filter.
Figure 17:
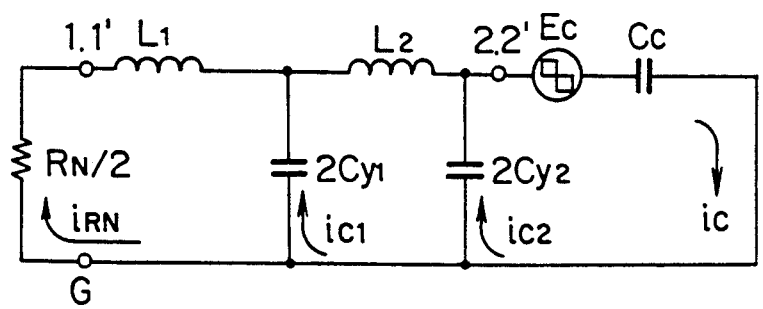
FIG. 17 shows an equivalent circuit of the circuit shown in FIG. 16 for attenuating common mode noise.
Figure 18:
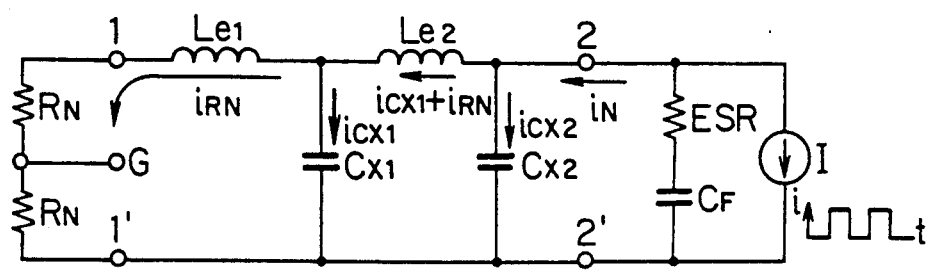
FIG. 18 shows an equivalent circuit of the circuit shown in FIG. 16 for attenuating normal mode noise.

In the circuit shown in FIG. 16, the X capacitor $C_{x1}$ is inserted between the power lines on the load side of the balun coil $L_1$, and the X capacitor $C_{x2}$ is inserted between the power lines on the load side of the balun coil $L_2$. In the circuit shown in FIG. 8, the X capacitor $C_{x0}$ is inserted between the power lines on the input side of the balun coil $L_1$, and the X capacitor $C_{x1}$ is inserted between the power lines on the input side of the balun coil $L_2$.

The line filter employing the arrangement shown in FIG. 8 has a large attenuating effect for the normal mode noise. The present inventors detail this fact in the Japanese Patent application No. 1987-316794, filed on Dec. 15, 1987, which resulted in Japanese Patent Laid open No. 1989-160357.

The present invention discloses how to select the values of $C_{x0}$, $C_{x1}$, $L_{1e}$, and $L_{2e}$ for making the line filter arrangement shown in FIG. 8 smaller and more lightweight.

In FIG. 9, assuming that the waveform of I is 50 KHz (T=20 uS), $C_{x0}+C_{x1}=0.47$ $\mu F$ (constant) is established, and:

$Le \cong 100$ $\mu H$ $Re \cong 10$ $\Omega$ $RN = 50$ $\Omega$ $CN = 0.1$ $\mu F$ or less $CF = 270$ $\mu F$ or less $RF = 0.2$ $\Omega$ $en = 0.163$ V (50 KHz, Ton = 3.75 $\mu S$)

Figure 10:
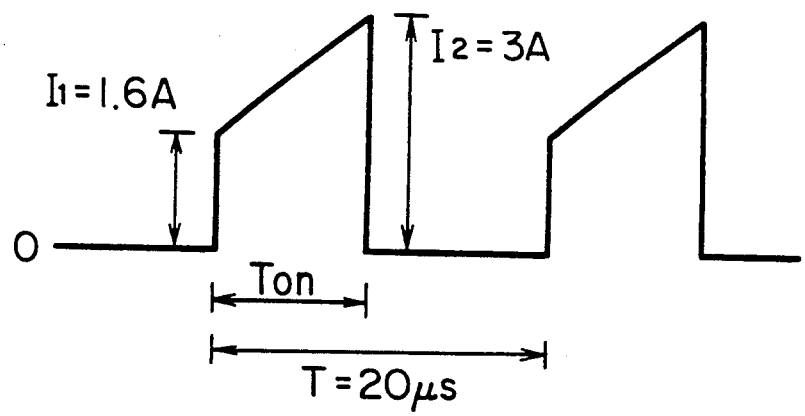
FIG. 10 shows a waveform of power current flowing through the circuit shown in FIG. 9.

$Vn = 2.118$ mV (50 KHz)

and $L_{1e} = 0.2$ mH. The process for obtaining a value for $L_{2e}$ will now be described. In FIG. 9, because of $R_F >> 1/\omega C_F$, ($\omega$: switching frequency), the voltage en of the noise source can be represented by:

$$en = R_F \sqrt{a(n)^2 + b(n)^2}$$

where:

$a(n) = I_1 \sin \theta/n\pi - (I_2 - I_1) \times (1 - \cos \theta)/n\pi\theta$ $b(n) = I_1/n\pi - I_2 \cos \theta/n\pi + (I_2 - I_1) \sin \theta/n\pi\theta$ $\theta = 2\pi n\delta$, $\delta = 0.5$ Ei min/E $I_1$ and $I_2$ respectively denote the value of the switching current at the times of t=0 and t=Ton as shown in FIG. 10.

Ei min denotes a minimum input voltage where the pulse width of the switching current is $Ton = \frac{1}{2}T$. This is a minimum voltage which allows the pulse width to be controlled.

Assuming that an input voltage Ei=280 V and Ei min=105 V, the voltage en of the source noise is:

$e(1) = 0.163$ V for the fundamental wavelength (n=1) shown in FIG. 10, or where n=2 or 3

$e(2) = 0.1365$ V, $e(3) = 0.0983$ V for a second or third harmonic. Assuming that:

$C_{x0}, C_{x1} \geq 0.1$ $\mu F$ $L_{1e}, L_{2e} \geq 0.05$ mH the values of filter components will be computed in relation to the fundamental wavelength only.

At the B level of VDE0871, the regulated value is:

$Vn(1) = 2.118$ mV (50 KHz, 66.5 dB)

$Vn(2) = 1.20$ mV (100 KHz, 61.6 dB)

Given en (1), Vn(1), and $C_{x0} + C_{x1} = CT$ (=constant), $L_{1e}$, $L_{2e}$ are computed as follows.

Figure 11:
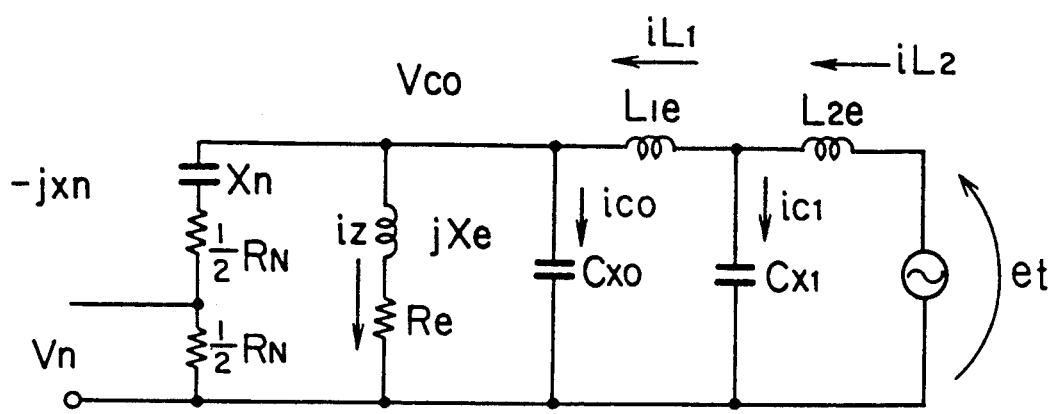
FIG. 11 shows the definition of current and voltage in the circuit shown in FIG. 9.

Then, reference will be directed to several factors, such as a current value or a voltage value in the circuit shown in FIG. 9, which are defined as shown in FIG. 11. In FIG. 11, for convenience of calculation, RN is redefined as half of RN in FIG. 9. (RN in FIG. 11 = 100$\Omega$, RN in FIG. 9 = 50$\Omega$).

Assuming 1 amp flows through RN, then $Vn = 1$ $amp \times \frac{1}{2}RN = \frac{1}{2}RN$ Then, the voltage at both terminals of $C_{x0}$ is:

$VC_0 = RN - jXn$

The current flowing through Xe and Re is:

$iz = Vco/(Re + jXe)$
$\phantom{iz} = izr - jizi$ $izr = (RNRe - XnXe)/(Re^2 + Xe^2)$ $izi = (RNXe + ReXn)/(Re^2 + Xe^2)$ The current flowing through $C_{x0}$ is:

$ico = j\omega C_{x0} V_{co} = XnY_{co} + jRNY_{co}$ $Y_{co} = \omega C_x$

The current flowing through $L_{1e}$ is:

$i_{L1} = 1 + iz + i_{co}$ $i_{L1} = i_{L1r} + ij_{L1i}$ $i_{L1r} = 1 + izr + XnY_{co}$ $i_{L1i} = RNY_{co} - izi$ The voltage across $L_{1e}$ is:

$V_{L1} = j\omega L_{1e} \cdot I_{L1}$;
$V_1 = \omega L_{1e}$
$\therefore V_{L1} = -X_{L1}i_{L1i} + jX_{L1}i_{L1r}$ The voltage across $C_{x1}$ is:

$V_{c1} = V_{co} + V_{L1}$
$\therefore V_{c1} = RN - X_{L1}i_{L1i} + j(X_{L1}i_{L1r} - X_n)$ The current flowing through $C_{x1}$ is:

$$i_{c1} = j\omega C_{x1} \cdot V_{c1};$$

$$Y_{c1} = \omega C_{x1}$$

$$\therefore i_{c1} = -Y_{c1}V_{c1}i + jY_{c1}V_{c1}r$$

The current flowing through $L_{2e}$ is:

$$i_{L2} = i_{L1} + i_{c1}$$

$$\therefore i_{L2} = i_{L2}r + ji_{L2}i$$

$$i_{L2}r = i_{L1}r + i_{c1}r$$

$$i_{L2}i = i_{L1}i + i_{c1}i$$

The voltage across $L_{2e}$ is:

$$V_{L2} = j\omega L_{2e}i_{L2};$$

$$\omega L_{2e} = X_{L2}$$

$$V_{L2} = -X_{L2}i_{L2}i + jX_{L2}i_{L2}r$$

The source voltage is:

$$e_t = V_{c1} + V_{L2}$$

$$\therefore e_t = e_{tr} + je_{ti}$$

$$e_{tr} = V_{c1}r - X_{L2}i_{L2}i$$

$$e_{ti} = V_{c1}i + X_{L2}i_{L2}r$$

By dividing both sides of all of the foregoing formulas by RN, these formulas may be transformed into formulas representing a ratio over 2Vn because of the given relation of RN=2 Vn. Thus, assuming that $(e_t/2Vn)^2 = (e_n/2Vn)^2 = r$ and representing an unknown $X_{L2}$ (related to $L_{2e}$) with x, x is given by the following formula:

$$x = (ag - bf \pm \sqrt{D})/(f^2 + g^2)$$

where $$a = V_{c1}r, \ b = V_{c1}i, \ f = i_{L2}r,$$

$$g = i_{L2}i,$$

$$D = r(f^2 + g^2) - (af + bg)^2$$

Thus, given the source noise voltage en, the regulated value Vn, and selectable values $C_{x0}$, $C_{x1}$ and $L_{1e}$, $L_{2e}$ is given by:

$$L_{2e} = X/\omega$$

Assuming that $L_{1e}$ is 0.2 mH if $C_{x0} + C_{x1} = CT = 0.47$ μF, therefore, $L_{2e}$ can be computed.

At the same time, the source noise fundamental wavelength voltage across $R_F$ is 0.163 V, and Vn is given by;

$$Vn = 0.00118 \text{ V}$$

which meets the B level of the noise voltage regulated value VDE0871 at 50 KHz.

Figure 12:
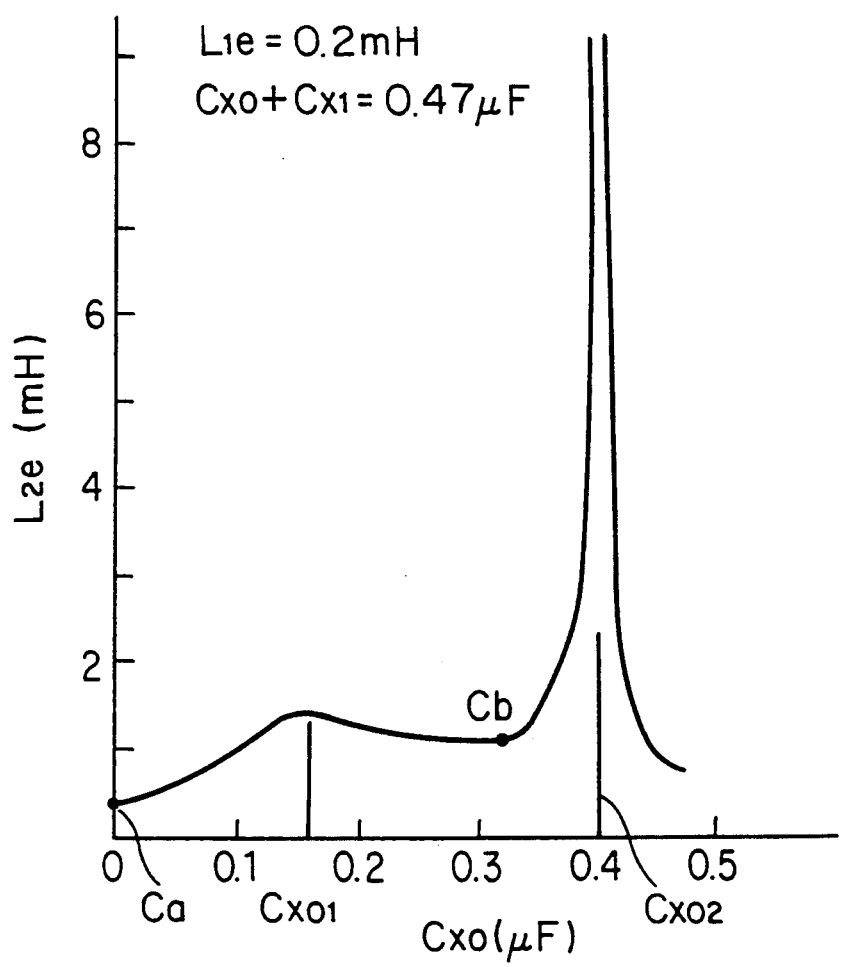
FIGS. 12 and 13 are graphs showing inductance versus capacitance.

The damping capacity of the filter corresponds to (0.163/0.00118), where $L_{2e}$ has a value shown in FIG. 12.

Further, in FIG. 12, Ca denotes a value of $C_{x0}$ (=0 μF) minimizin $L_{2e}$, and Cb denotes a value of $C_{x0}$ (=0.32 μF) locally minimizing $L_{2e}$.

The smaller-sized line filter requires as small a value of $L_{2e}$ as possible. Hence, assuming that:

$$C_{x0} = Ca = 0 \text{ μF, and}$$

$$C_{x1} = 0.47 \text{ μF} - C_{x0} = 0.47 \text{ μF},$$

$L_{2e}$ has a value of;

$$L_{2e} = 0.3 \text{ mH}$$

In FIG. 12, $C_{x01}$ and $C_{x02}$ respectively denote a local maximum value and an absolute maximum value which respectively denote serial resonance points between $L_{1e}/L_{2e}$ (serial synthetic value of inductance) and Co, and between $L_{1e}$ and $C_{x1}$.

Figure 13:
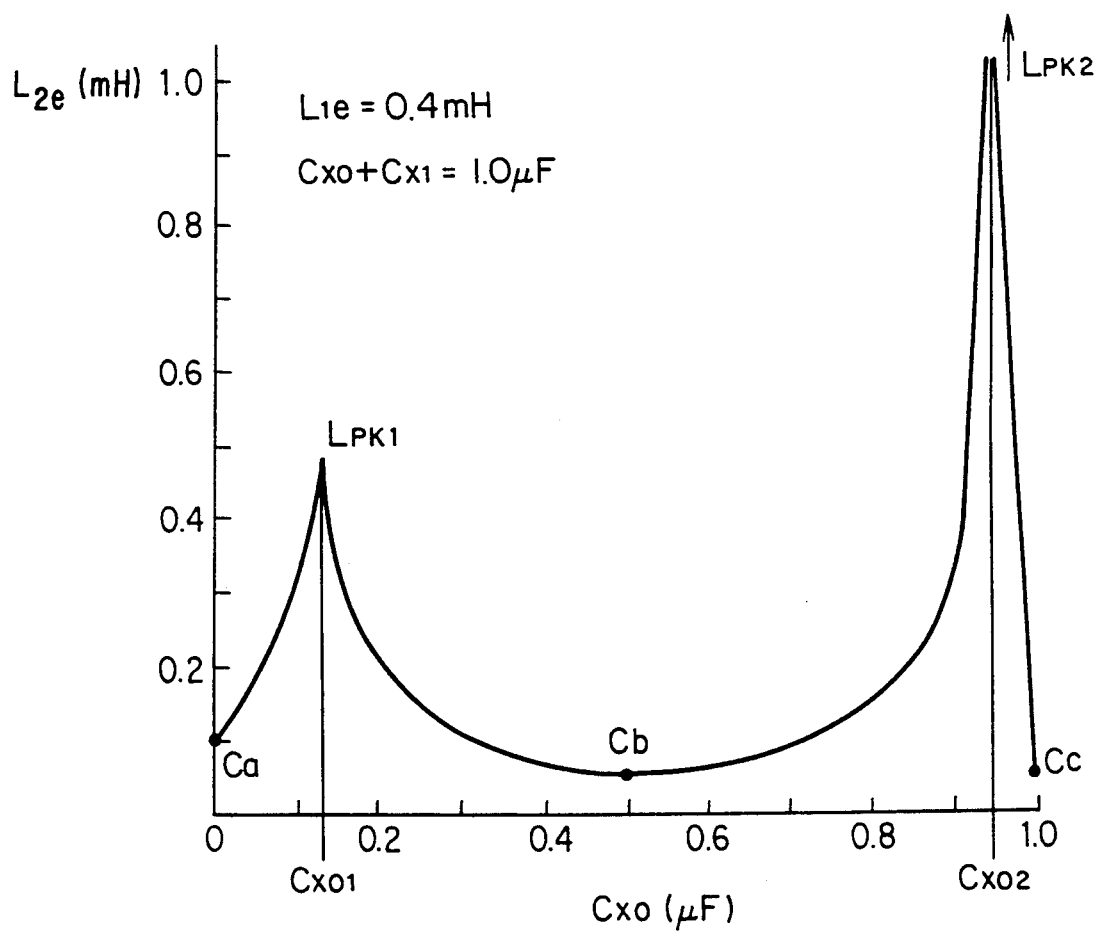

FIG. 13 shows a characteristic curve of $L_{2e}$ depicted as a result of changing $L_{1e}$ in the range of 0.04 mH to 0.6 mH. A first peak is shown by LPK1, and a second peak is shown by LPK2. The minimum value of $L_{2e}$ exists in case of:

$$C_{x0} = 0 \text{ μF}, C_{x1} = 0.47 \text{ μF}$$

Further, assuming that $C_{x0} + C_{x1} = 0.68$ μF is given, $L_{2e}$ has a minimum value in case of;

$$C_0 = 0 \text{ μF}, C_{x1} = 0.68 \text{ μF}$$

Then, increasing the value as shown below:

$$C_{x0} + C_{x1} = 1 \text{ μF}$$

$L_{2e}$ has a minimal value on the following point as shown in FIG. 13:

$$C_{x0} = Cb \approx 0.5 \text{ μF}$$

In case of $C_{x0} + C_{x1} = 1$ μF, under the state of $L_{1e} < 0.2$ mH, $L_{2e}$ has a minimal value when:

$$C_{x0} = Ca = 0 \text{ μF}$$

Figure 14:
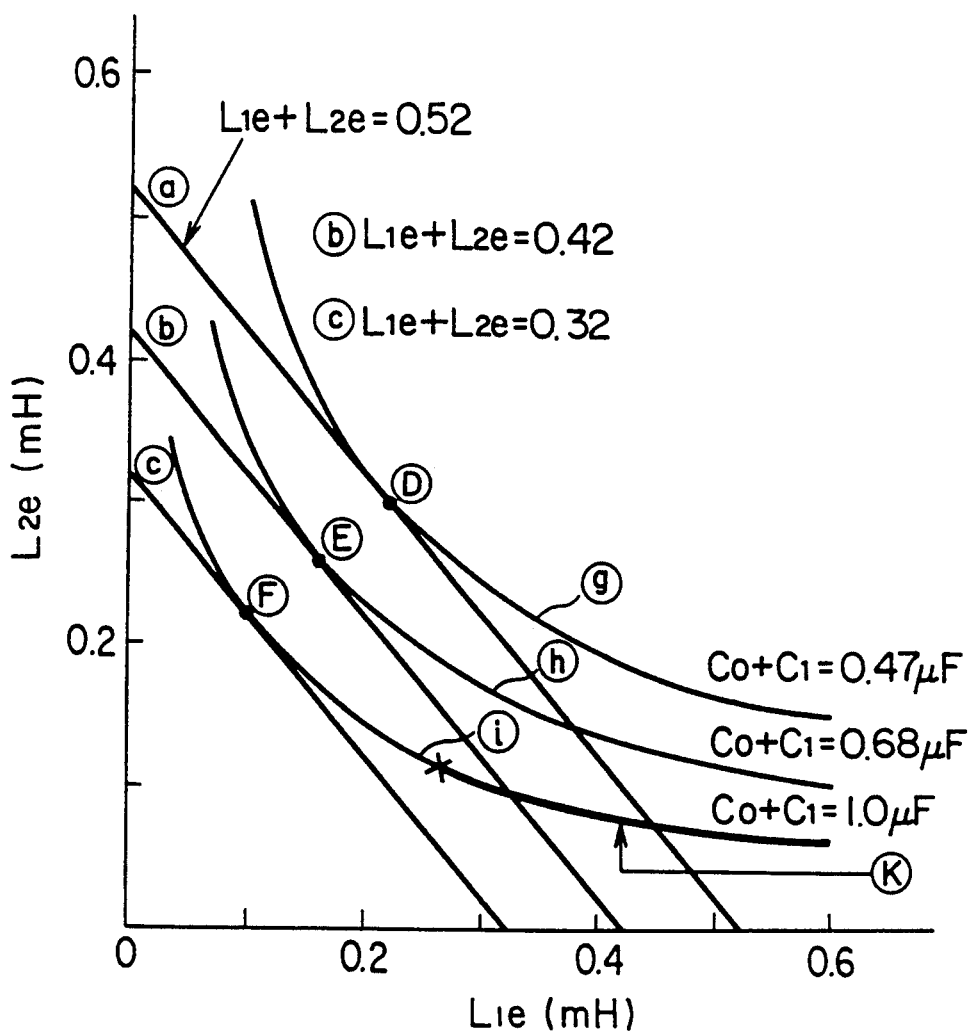
FIG. 14 shows the relation of a desired minimal value for inductance $L_{2e}$ versus inductance $L_{1e}$.

The curves g, h and i shown in FIG. 14 indicate characteristic curves of $L_{1e}$ depicted in relation to the foregoing minimal values of $L_{2e}$. Each curve determines $L_{2e}$ if $L_{1e}$ is given when:

$$C_{x0} + C_{x1} = constant$$

These curves contact each straight line a, b, or c on point D, E, or F, and the straight lines a, b, and c are representative of:

$$L_{1e} + L_{2e} = constant$$

These contact points respectively correspond to a point minimizing a sum of $$L_{1e} + L_{2e}$$

The characteristic curves g, h, i are depicted under the state of $C_{x0} + C_{x1} = constant$. Hence, each curve shows an optimal sum of the X capacitors.

The points of contact D, E, and F indicate a minimal sum of choke coil inductances. Hence, it shows the optimal inductance relationship.

The points of contact D, E, and F signify the point optimizing both the X capacitor and the choke coil. The k portion on the i curve signifies a section having a minimal value of $L_{2e}$:

$$C_{x0} \cong C_{x1} = \tfrac{1}{2}(1.0\ \mu F)$$

The portion satisfying the condition $L_{1e} < 0.26$ mH is a point where $L_{2e}$ has a minimal value at the point:

$$C_{x0} = 0,\ C_{x1} = 1.0\ \mu F$$

These minimal points D, E, and F satisfy the condition of:

$$C_{x0} = 0,\ C_{x1} = \max,\ L_{1e} < L_{2e}$$

Lastly, a discussion will be directed to why the optimal point occurs when $C_{x0} = 0$.

If $C_{x0} > 0$, the circuit approaches a series resonance state caused by $C_{x0}$ and $L_e // L_{1e}$ so that the noise voltage between terminals 1' and 1 increases.

Thus, lowering the noise voltage to the regulated value requires a larger value of $L_{2e}$.

If a sum of $C_{x0} + C_{x1}$ rises to about 1 $\mu$F, the L—C step type attenuating effect resulting from the equally-divided capacitance (1 $\mu$F) located on $C_{x0}$ is better than the attenuating effect if the capacitance (1 $\mu$F) were focused on $C_{x1}$. As shown in FIG. 13, therefore $L_{2e}$ has a minimal value when:

$$C_{x0} \cong \tfrac{1}{2}(C_{x0} + C_{x1})$$

Figure 15:
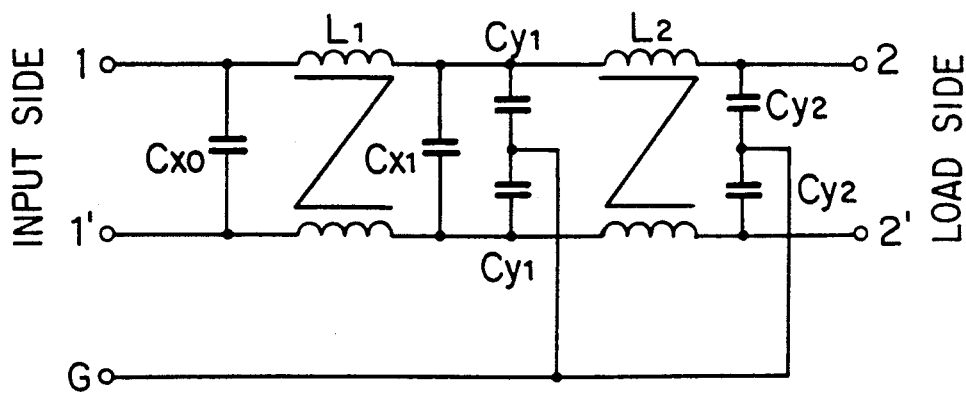
FIG. 15 is a circuit diagram showing another line filter.

FIG. 15 shows the embodiment of the arrangement employing the foregoing phenomenon. This embodiment corresponds to the K section of the curve in FIG. 14 when:

$$C_{x0} = C_{x1},\ L_{1e} > L_{2e}$$

The size of a choke coil is proportional to the amount of energy E stored therein:

$$E = \tfrac{1}{2}LI^2\ (L\text{: inductance, I: supply current})$$

The sum of the inductances of the two choke coils becomes minimal and the choke coils become most lightweight when:

$$E_1 + E_2 = minimum,\ \text{that is}\ L_{1e} + L_{2e} = minimum$$

The points D, E, and F in FIG. 14 correspond to the minimal inductance choke coil and most lightweight choke coil, meeting the foregoing conditions. Further, the curves shown in FIGS. 12 and 13 are computed based on a given $C_{x0} + C_{x1}$. Hence, by meeting the conditions of:

$$C_{x0} = 0,\ C_{x1} = \max\ \text{or}\ C_{x0} \cong C_{x1} = \tfrac{1}{2}(\max)$$

$C_{x0}$ and $C_{x1}$ are optimized. The point corresponding to the smallest and most lightweight X capacitor rests on the curve g, h, or i shown in FIG. 14.

The circuit shown in FIG. 9 employs the leakage inductance of a balun type common mode choke coil as $L_{1e}$ and $L_{2e}$, but the same effect may be achieved by an independent choke coil.

Considering that the balun type common mode choke coil has a small normal mode inductance, the independent choke coil may be more advantageous.

If a shield is applied on a switching converter and transformer to attenuate the electrostatic capacitance between the primary coil and the secondary coil, the normal mode noise becomes more dominant. In this case, the circuits shown in FIGS. 7 and 15 may employ a choke coil in place of a balun coil.

Though the foregoing description does not distinctively separate the inductance of the balun coil into the self-inductance L and leakage inductance Le, the balun coil itself serves to attenuate the common mode noise using its self-inductance.

On the other hand, the leakage inductance Le serves to suppress the normal mode noise.

The foregoing description employs Le for removing the normal mode noise and L for removing the common mode noise.

In order to determine the values of the choke coils $L_{1e}$ and $L_{2e}$, this embodiment (1) plots a curve having a minimal value of $L_{2e}$, (2) making the following straight line:

$$L_{1e} + L_{2e} = constant$$

such that this line contacts the curve, and (3) selecting a contact point at or nearby the intersection of the line and the curve.

Further, in order to select the values of the X capacitors $X_{x0}$ and $X_{x1}$, under the condition of $C_{x0} + C_{x1} = constant$, it is possible to compute a minimal value of $L_{2e}$ by choosing a value of $L_{1e}$, or vice versa, and then select a value of $C_{x0}$ or $C_{x1}$ corresponding to the minimal value.

The result is a line filter which is small and lightweight and which effectively attenuates the normal mode noise.

Further, the line filter of this invention more effectively attenuates high frequency noise because the $C_{y2}$ capacitor located on the conventional line filter works as the X capacitor for normal noise.

What is claimed is:

1. A line filter comprising:
   a first coil with inductance $L_1$;
   a second coil of a balun with normal mode inductance $L_2$ and common mode inductance $L_{2c}$ connected in series with said first coil;
   a third coil with inductance $L_1$;
   a fourth coil of said balun with normal mode inductance $L_2$ and common mode inductance $L_{2c}$ connected in series with said third coil;
   a first X capacitor disposed between a first node connecting said first coil with said second coil and a second node connecting said third coil with said fourth coil;
   a second X capacitor disposed between an input side of said first coil and an input side of said third coil;
   a third Y capacitor disposed between a ground voltage potential and said first node;
   a fourth Y capacitor disposed between said ground voltage potential and said second node;
   a fifth Y capacitor disposed between said ground and an output side of said third coil, said fifth Y capacitor having a capacitance value greater than the capacitance of said third Y capacitor; and
   a sixth Y capacitor disposed between said ground and an output side of said fourth coil, said sixth Y capacitor having a capacitance value greater than the capacitance of said fourth Y capacitor;
wherein said second X capacitance has a value approximately equal to the value of said first X capacitor if a circuit constant LT0 is less than a total inductance LT, where:

$$LT0 = a \cdot (b \cdot CT)^{-dF+e}$$

and where
$LT = L_1 + L_2$ measured in millihenries;
a represents a proportional factor of the total inductance equal to $2.39 \times 10^6$;
b represents a proportional factor of the total electrostatic capacitance equal to 141;
CT represents a sum of the capacitance of said first X capacitor and said second X capacitor measured in microfarads;
d represents a frequency proportional factor equal to 0.0132;
e represents a frequency correction factor equal to $-1.055$;
F represents a minimum frequency for supression by the line filter measured in kilohertz.

2. A line filter comprising:
a first coil of a balun with normal mode inductance $L_1$ and common mode inductance $L_{1c}$;
a second coil with inductance $L_2$;
a third coil of said balun with normal mode inductance $L_1$ and common mode inductance $L_{1c}$;
a fourth coil with inductance $L_2$;
a first X capacitor disposed between a first node connecting said first coil with said second coil and a second node connecting said third coil with said fourth coil;
a second X capacitor disposed between an input side of said first coil and an input side of said third coil;
a third Y capacitor disposed between a ground voltage potential and said first node;
a fourth Y capacitor disposed between said ground voltage potential and said second node;
a fifth Y capacitor disposed between said ground and an output side of said third coil, said fifth Y capacitor having a capacitance value greater than the capacitance of said third Y capacitor; and
a sixth Y capacitor disposed between said ground and an output side of said fourth coil, said sixth Y capacitor having a capacitance value greater than the capacitance of said fourth Y capacitor;
wherein said second X capacitor has a value approximately equal to the value of said first X capacitor if a circuit constant LT0 is less than a total inductance LT, where:

$$LT0 = a \cdot (b \cdot CT)^{-dF+e}$$

and where
$LT = L_1 + L_2$ measured in millihenries;
a represents a proportional factor of the total inductance equal to $2.39 \times 10^6$;
b represents a proportional factor of the total electrostatic capacitance equal to 141;
CT represents a sum of the capacitance of said first X capacitor and said second X capacitor measured in microfarads;
d represents a frequency proportional factor equal to 0.0132;
e represents a frequency correction factor equal to $-1.055$;
F represents a minimum frequency for suppression by the line filter measured in kilohertz.

3. A line filter comprising:
a first coil of a first balun with normal mode inductance $L_1$ common mode inductance $L_{1c}$;
a second coil of a second balun with normal mode inductance $L_2$ and common mode inductance $L_{2c}$ connected in series with said first coil of said first balun;
a third coil of said first balun with normal mode inductance $L_1$ and common mode inductance $L_{1c}$;
a fourth coil of said second balun with normal mode inductance $L_2$ and common mode inductance $L_{2c}$ connected in series with said third coil of said first balun;
a first X capacitor disposed between a first node connecting said first coil with said second coil and a second node connecting said third coil with said fourth coil;
a second X capacitor disposed between an input side of said first coil and an input side of said third coil;
a third Y capacitor disposed between a ground voltage potential and said first node;
a fourth Y capacitor disposed between said ground voltage potential and said second node;
a fifth Y capacitor disposed between said ground and an output side of said third coil, said fifth Y capacitor having a capacitance value greater than the capacitance of said third Y capacitance; and
a sixth Y capacitor disposed between said ground and an output side of said fourth coil, said sixth Y capacitor having a capacitance value greater than the capacitance of said fourth Y capacitor;
wherein said second X capacitor has a value approximately equal to the value of said first X capacitor if a circuit constant LT0 is less than a total inductance LT, where:

$$LT0 = a \cdot (b \cdot CT)^{-dF+e}$$

and where
$LT = L_1 + L_2$ measured in millihenries;
a represents a proportional factor of the total inductance equal to $2.39 \times 10^6$;
b represents a proportional factor of the total electrostatic capacitance equal to 141;
CT represents a sum of the capacitance of said first X capacitor and said second X capacitor measured in microfarads;
d represents a frequency proportional factor equal to 0.0132;
a represents a frequency correction factor equal to $-1.055$;
F represents a minimum frequency for supression by the line filter measured in kilohertz.

4. A line filter comprising:
a first coil with inductance $L_1$;
a second coil with inductance $L_2$ connected in series with said first coil;
a third coil with inductance $L_1$;
a fourth coil with inductance $L_2$ connected in series with said third coil;
a first X capacitor disposed between a first node connecting said first coil with said second coil and a second node connecting said third coil with said fourth coil; and a second X capacitor disposed between an input side of said first coil and an input side of said third coil, wherein said second X capacitor has a value approximately equal to the value of said first X capacitor if a circuit constant LT0 is less than a total inductance LT, where:

$$LT0 = a \cdot (b \cdot CT)^{-dF+e}$$

and where $LT = L_1 + L_2$ measured in millihenries;

a represents a proportional factor of the total inductance equal to $2.39 \times 10^6$;

b represents a proportional factor of the total electrostatic capacitance equal to 141;

CT represents a sum of the capacitance of said first X capacitor and said second X capacitor measured in microfarads;

d represents a frequency proportional factor equal to 0.0132;

e represents a frequency correction factor equal to $-1.055$; and

F represents a minimum frequency for supression by the line filter measured in kilohertz.

5. A line filter comprising:

a first coil with inductance $L_1$;

a second coil with inductance $L_2$ connected in series with said first coil;

a third coil with inductance $L_1$;

a fourth coil with inductance $L_2$ connected in series with said third coil;

a first X capacitor disposed between a first node connecting said first coil with said second coil and a second node connecting said third coil with said fourth coil, wherein said first X capacitor has a value equal to CT if a circuit constant LT0 is greater than a total inductance LT, where:

$$LT0 = a \cdot (b \cdot CT)^{-dF+e}$$

and where $LT = L_1 + L_2$ measured in millihenries;

a represents a proportional factor of the total inductance equal to $2.39 \times 10^6$;

b represents a proportional factor of the total electrostatic capacitance equal to 141;

CT represents the capacitance of said first X capacitor measured in microfarads;

d represents a frequency proportional factor equal to 0.0132;

e represents a frequency correction factor equal to $-1.055$; and

F represents a minimum frequency for supression by the line filter measured in kilohertz.

6. A method for constructing a line filter having a pair of input terminals and a pair of output terminals, comprising the steps of:

connecting a first coil with inductance $L_1$ to a first one of the pair of input terminals;

connecting a third coil with inductance $L_1$ to a second one of the pair of input terminals;

connecting a second coil with an inductance $L_2$ between said first coil and a first one of said output terminals;

connecting a fourth coil with an inductance $L_2$ between said third coil and a second one of said output terminals;

connecting a first X capacitor between a first node connecting said first coil with said second coil and a second node connecting said third coil with said fourth coil; and only if a circuit constant LT0 is less than a total inductance LT, connecting a second X capacitor with a value approximately equal to a value of said first X capacitor between said first one of said input terminals and said second one of said input terminals, where:

$$LT0 = a \cdot (b \cdot CT)^{-dF+e}$$

and where $LT = L_1 + L_2$ measured in millihenries;

a represents a proportional factor of the total inductance equal to $2.39 \times 10^6$;

b represents a proportional factor of the total electrostatic capacitance equal to 141;

CT represents a sum of the capacitance of said first X capacitor and said second X capacitor measured in microfarads;

d represents a frequency proportional factor equal to 0.0132;

e represents a frequency correction factor equal to $-1.055$; and

F represents a minimum frequency for suppression by the line filter measured in kilohertz.

7. A line filter comprising:

a first coil with inductance $L_1$;

a second coil with inductance $L_2$ connected in series with said first coil;

a third coil with inductance $L_1$;

a fourth coil with inductance $L_2$ connected in series with said third coil;

a first capacitor disposed between a first node connecting said first coil with said second coil and a second node connecting said third coil with said fourth coil; and a second capacitor disposed between an input side of said first coil and an input side of said third coil, wherein said first and third coils in combination exhibit a normal mode inductance of $L_{1e}$, and said second and fourth coils in combination exhibit a normal mode inductance of $L_{2e}$, $L_{1e}$ being determined at a point of intersection between a first function f1 and a second function f2, said first function f1 expressing $L_{2e}$ as a function of $L_{1e}$:

$$L_{2e} = f1(L_{1e})$$

and said second function f2 expressing $L_{2e}$ as a constant minus $L_{1e}$:

$$L_{2e} = f2(L_{1e}) = constant - L_{1e}$$

where $f1(L_{1e}) = 1/\omega \cdot [(ag - bf + -D^{\frac{1}{2}})/(f^2 + g^2)]$ and where $\omega$ is a switching frequency;

$V_{C1}$ is the sum of the voltages across said second capacitor and said first coil;

a is a real number portion of $V_{C1}$;

b is an imaginary number portion of $V_{C1}$;

$i_{L2}$ is a current flowing through said second coil;

f is a real number portion of $i_{L2}$, g is an imaginary number portion of $i_{L2}$; and $D = r(f^2 + g^2) - (af + bg)^2$, where $r = (e_n/2V_n)^2$, $e_n$ is a noise voltage generated between the output of the filter, and $V_n$ is a normal mode noise voltage; and wherein said second capacitor has an equivalent capacitive value $C_{X0}$ determined at a minimum of a third function, f3 ($C_{X0}$), expressing $L_{2e}$ as a function of $C_{X0}$.

8. A method for constructing a line filter having a pair of input terminals and a pair of output terminals, comprising the steps of:

connecting a first coil with inductance $L_1$ to a first one of the pair of input terminals:

connecting a third coil with inductance $L_1$ to a second one of the pair of input terminals;

connecting a second coil with an inductance $L_2$ between said first coil and a first one of said output terminals;

connecting a fourth coil with an inductance $L_2$ between said third coil and a second one of said output terminals;

connecting a first capacitor disposed between a first node connecting said first coil with said second coil and a second node connecting said third coil with said fourth coil; and connecting a second capacitor between said first one of said input terminals and said second one of said input terminals, wherein said first and third coils in combination exhibit a normal mode inductance of $L_{1e}$, and said second and fourth coils in combination exhibit a normal mode inductance of $L_{2e}$, $L_{1e}$ being determined at a point of intersection between a first function f1 and a second function f2, said first function f1 expressing $L_{2e}$ as a function of $L_{1e}$:

$$L_{2e} = f1(L_{1e})$$

and said second function f2 expressing $L_{2e}$ as a constant minus $L_{1e}$:

$$L_{2e} = f2(L_{1e}) = \text{constant} - L_{1e}$$

where $$f1(L_{1e}) = 1/\omega \cdot [(ag - bf + -D^{\frac{1}{2}})/(f^2 + g^2)]$$

and where $\omega$ is a switching frequency;

$V_{C1}$ is the sum of the voltages across said second capacitor and said first coil;

a is a real number portion of $V_{C1}$;

b is an imaginary number portion of $V_{C1}$;

$i_{L2}$ is a current flowing through said second coil;

f is a real number portion of $i_{L2}$, g is an imaginary number portion of $i_{L2}$; and $D = r(f^2 + g^2) - (af + bg)^2$, where $r = (e_n/2V_n)^2$, $e_n$ is a noise voltage generated between the output of the filter, and $V_n$ is a normal mode noise voltage; and wherein said second capacitor has an equivalent value $C_{X0}$ determined at a minimum of a third function, f3 ($C_{X0}$), expressing $L_{2e}$ as a function of $C_{X0}$.

9. A line filter comprising:

a first coil of a first balun with normal mode inductance $L_1$ and common mode inductance $L_{1c}$;

a second coil of a second balun with normal mode inductance $L_2$ and common mode inductance $L_{2c}$ connected in series with said first coil of said first balun;

a third coil of said first balun with normal mode inductance $L_1$ and common mode inductance $L_{1c}$;

a fourth coil of said second balun with normal mode inductance $L_2$ and common mode inductance $L_{2c}$ connected in series with said third coil of said first balun;

a first capacitor disposed between a first node connecting said first coil with said second coil and a second node connecting said third coil with said fourth coil; and a second capacitor disposed between an input side of said first coil and an input side of said third coil, wherein said first and third coils in combination exhibit a normal mode inductance of $L_{1e}$, and said second and fourth coils in combination exhibit a normal mode inductance of $L_{2e}$, $L_{1e}$ being determined at a point of intersection between a first function f1 and a second function f2, said first function f1 expressing $L_{2e}$ as a function of $L_{le}$:

$$L_{2e} = f1(L_{1e})$$

and said second function f2 expressing $L_{2e}$ as a constant minus $L_{1e}$:

$$L_{2e} = f2(L_{1e}) = \text{constant} - L_{1e}$$

where $$f1(L_{1e}) = 1/\omega \cdot [(ag - bf + -D^{\frac{1}{2}})/(f^2 + g^2)]$$

and where $\omega$ a switching frequency;

$V_{C1}$ is the sum of the voltages across said second capacitor and said first coil;

a is a real number portion of $V_{C1}$;

b is an imaginary number portion of $V_{C1}$;

$i_{L2}$ is a current flowing through said second coil;

f is a real number portion of $i_{L2}$;

g is an imaginary number portion of $i_{L2}$; and $D = r(f^2 + g^2) - (af + bg)^2$, where $r = (e_n/2V_n)^2$, $e_n$ is a noise voltage generated between the output of the filter, and $V_n$ is a normal mode noise voltage; and wherein said second capacitor has an equivalent value $C_{X0}$ determined at a minimum of a third function, f3 ($C_{X0}$), expressing $L_{2e}$ as a function of $C_{X0}$.

* * * * *

UNITED STATES PATENT AND TRADEMARK OFFICE
CERTIFICATE OF CORRECTION

PATENT NO. : 5,061,913

DATED : October 29, 1991

INVENTOR(S) : Sadao Okochi et al.

It is certified that error appears in the above-identified patent and that said Letters Patent is hereby corrected as shown below:

Abstract, line 9, after "normal" insert --mode--.

Claim 1, column 17, line 3, change "capacitance" to --capacitor--.

Claim 1, column 17, line 16, change "capacitance" to --capacitances--.

Claim 1, column 17, line 23, change "supression" to --suppression--.

Claim 2, column 17, line 64, change "capacitance" to --capacitances--.

Claim 3, columnn 18, line 7, before "common" insert --and--.

Claim 3, column 18, line 31, after "Y" change "capacitance" to --capacitor--.

Claim 3, column 18, line 49, change "capacitance" to --capacitances--.

Claim 3, column 18, line 54, before "represents" change "a" to --e--.

Claim 3, column 18, line 56, change "supression" to --suppression--.

Claim 4, column 19, line 16, change "capacitance" to --capacitances--.

UNITED STATES PATENT AND TRADEMARK OFFICE
CERTIFICATE OF CORRECTION

PATENT NO. : 5,061,913

DATED : October 29, 1991

INVENTOR(S) : Sadao Okochi et al.

It is certified that error appears in the above-identified patent and that said Letters Patent is hereby corrected as shown below:

Claim 4, column 19, line 23, change "supression" to --suppression--.

Claim 5, column 19, line 52, change "supression" to --suppression--.

Claim 6, column 20, line 18, change "capacitance" to --capacitances--.

Claim 8, column 21, line 48, change "$g^2$)" to --$g^2$)]--.

Claim 9, column 22, line 45, before "a" insert --is--.

Signed and Sealed this

Third Day of August, 1993

Attest:

MICHAEL K. KIRK

Attesting Officer     Acting Commissioner of Patents and Trademarks